United States Patent
Hirochi et al.

(10) Patent No.: US 11,177,143 B2
(45) Date of Patent: Nov. 16, 2021

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Yukitomo Hirochi, Toyama (JP); Takashi Nogami, Toyama (JP); Yoshihiko Yanagisawa, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 71 days.

(21) Appl. No.: 16/796,523

(22) Filed: Feb. 20, 2020

(65) Prior Publication Data

US 2020/0194287 A1 Jun. 18, 2020

Related U.S. Application Data

(63) Continuation of application No. PCT/JP2017/031630, filed on Sep. 1, 2017.

(51) Int. Cl.
*H01L 21/67* (2006.01)
*H01L 21/677* (2006.01)

(52) U.S. Cl.
CPC .. *H01L 21/67109* (2013.01); *H01L 21/67781* (2013.01)

(58) Field of Classification Search
CPC ......... H01L 21/67011; H01L 21/67098; H01L 21/67155; H01L 21/67161; H01L 21/6719
See application file for complete search history.

(56) References Cited

U.S. PATENT DOCUMENTS

| 5,788,447 A | 8/1998 | Yonemitsu et al. |
| 6,139,695 A * | 10/2000 | Washburn ............. C23C 14/352 118/719 |

(Continued)

FOREIGN PATENT DOCUMENTS

| JP | 09-104982 A | 4/1997 |
| JP | 2000-150618 A | 5/2000 |

(Continued)

OTHER PUBLICATIONS

Japanese Office Action dated Sep. 29, 2020 for Japanese Patent Application No. 2019-538888.

(Continued)

*Primary Examiner* — Jae Lee
(74) *Attorney, Agent, or Firm* — Volpe Koenig

(57) ABSTRACT

There is provided a technique that includes: a transfer chamber configured to transfer a substrate; at least two process chambers configured to process the substrate that is transferred from the transfer chamber by heating the substrate with a microwave generated from a heating device; and a cooling chamber spatially connected to the transfer chamber and disposed on a side wall of the transfer chamber between the at least two process chambers at an equal distance from the at least two process chambers, the cooling chamber including a first gas supplier configured to supply a purge gas that purges an internal atmosphere at a first gas flow rate and a first exhauster including an exhaust pipe configured to exhaust the purge gas, and the cooling chamber configured to cool the substrate heated by the microwave using the purge gas.

20 Claims, 9 Drawing Sheets

(56) References Cited

U.S. PATENT DOCUMENTS

| | | | |
|---|---|---|---|
| 2011/0088848 A1* | 4/2011 | Kim | H01J 37/32192 |
| | | | 156/345.41 |
| 2011/0318141 A1 | 12/2011 | Wi | |
| 2012/0093617 A1 | 4/2012 | Kudou et al. | |
| 2014/0107825 A1* | 4/2014 | Kubodera | G05B 19/4189 |
| | | | 700/112 |
| 2015/0096685 A1* | 4/2015 | Sato | H01L 21/67196 |
| | | | 156/345.32 |

FOREIGN PATENT DOCUMENTS

| | | |
|---|---|---|
| JP | 2010-507221 A | 3/2010 |
| JP | 2015-070045 A | 4/2015 |

OTHER PUBLICATIONS

International Search Report for PCT/JP2017/031630, dated Nov. 7, 2017.
Taiwanese Office Action dated May 28, 2020 for Taiwanese Patent Application No. 04498/10920505680.
Taiwanese Office Action dated May 28, 2020 for Taiwanese Patent Application No. 107128995.
Korean Office Action dated Jun. 17, 2021 for Korean Patent Application No. 10-2020-7004983.

\* cited by examiner

100

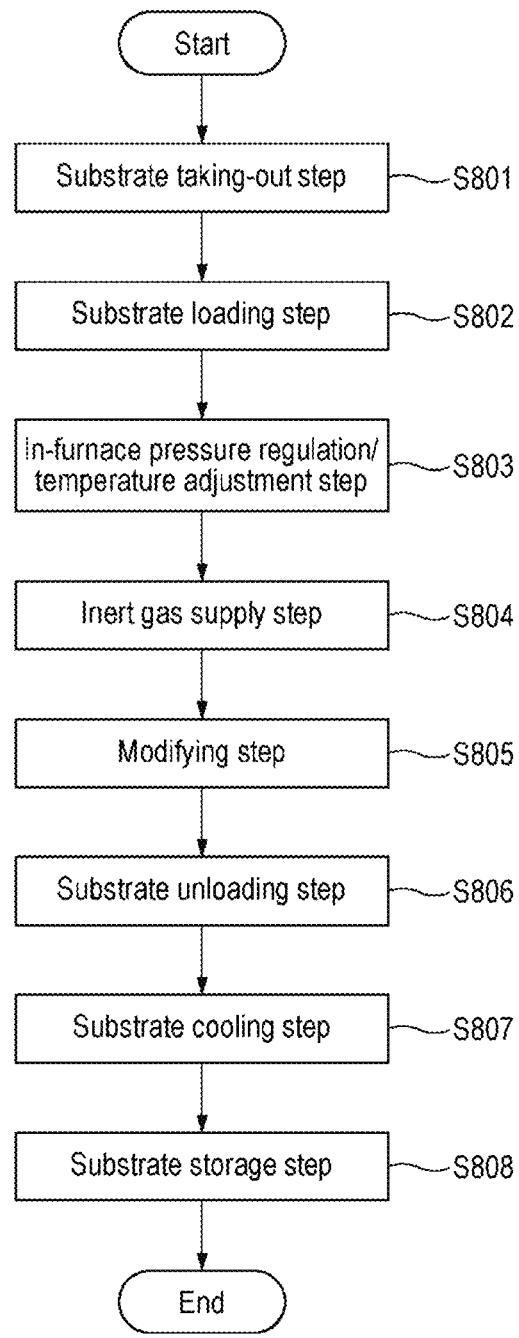

FIG. 9A

| STEP | 1 | 2 | 3 | 4 |
|---|---|---|---|---|
| Process chamber GV 205 | Close | Open | Open | Open |
| Transfer chamber pressure | 50Pa | 40Pa | 40Pa | 50Pa |
| Cooling chamber pressure | 40Pa | 40Pa | 30Pa | 40Pa |
| Opening/closing valve 406 | Close | Close | Open | Close |
| MFC403 | 100slm | 100slm | 100slm | 100slm |

FIG. 9B

| STEP | 5 | 6 | 7 | 8 |
|---|---|---|---|---|
| Process chamber GV 205 | Close | Open | Open | Close |
| Transfer chamber pressure | 50Pa | 60Pa | 60Pa | 50Pa |
| Cooling chamber pressure | 40Pa | 40Pa | 50Pa | 40Pa |
| Opening/closing valve 406 | Close | Close | Close | Close |
| MFC403 | 100slm | 100slm | 150slm | 150slm |

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a Bypass Continuation Application of PCT International Application No. PCT/JP2017/031630, filed on Sep. 1, 2017, the disclosure of which is incorporated herein in its entirety by reference

TECHNICAL FIELD

The present disclosure relates to a substrate processing apparatus, a method of manufacturing a semiconductor device, and a recording medium.

BACKGROUND

As a process for manufacturing a semiconductor device, for example, a modifying process is available and is represented by an annealing process in which a composition or a crystal structure in a thin film formed on a surface of a substrate in a process chamber is changed by heating the substrate using a heating device or a crystal defect or the like in the formed thin film is repaired. In recent years, semiconductor devices have been significantly miniaturized and highly integrated. Accordingly, there has been a demand for a modifying process for a high-density substrate on which a pattern having a high aspect ratio is formed. As a method of modifying such a high-density substrate, a heat treatment method using an electromagnetic wave has been studied.

In a process using an electromagnetic wave of the related art, it is necessary to provide a cooling step of cooling a substrate heated to a high temperature by a heat treatment in a process chamber. Therefore, a productivity may be reduced in some cases.

SUMMARY

Some embodiments of the present disclosure provide an electromagnetic wave processing technique capable of suppressing a decrease in productivity even when a substrate cooling step is provided.

According to an embodiment of the present disclosure, there is provided a technique that includes: a transfer chamber configured to transfer a substrate; at least two process chambers configured to process the substrate that is transferred from the transfer chamber by heating the substrate with a microwave generated from a heating device; and a cooling chamber spatially connected to the transfer chamber and disposed on a side wall of the transfer chamber between the at least two process chambers at an equal distance from the at least two process chambers, the cooling chamber including a first gas supplier configured to supply a purge gas that purges an internal atmosphere at a first gas flow rate and a first exhauster including an exhaust pipe configured to exhaust the purge gas, and the cooling chamber configured to cool the substrate heated by the microwave using the purge gas.

BRIEF DESCRIPTION OF DRAWINGS

FIG. 8 is a view showing a flow of a substrate processing according to an embodiment of the present disclosure.

FIG. 9A is a view showing control contents of respective parts when a pressure in a transfer chamber is reduced by opening a gate valve of the process chamber, and FIG. 9B is a view showing control contents of the respective parts when a pressure in a transfer chamber is increased by opening the gate valve of the process chamber.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An Embodiment of the Present Disclosure

Hereinafter, an embodiment of the present disclosure will be described with reference to the drawings.

(1) Configuration of Substrate Processing Apparatus

In the present embodiment, a substrate processing apparatus 100 according to an embodiment of the present disclosure is configured as a single-wafer heat treatment apparatus that performs various heat treatments on one wafer or a plurality of wafers. The substrate processing apparatus 100 will be described as an apparatus that performs an annealing process (modifying process) using an electromagnetic wave described below. In the substrate processing apparatus 100 according to the present embodiment, a FOUP (Front Opening Unified Pod: hereinafter referred to as a pod) 110 is used as a storage container (carrier) configured to store wafers 200 as substrates. The pod 110 is also used as a transfer container configured to transfer the wafers 200 between various substrate processing apparatuses.

Figure 1:
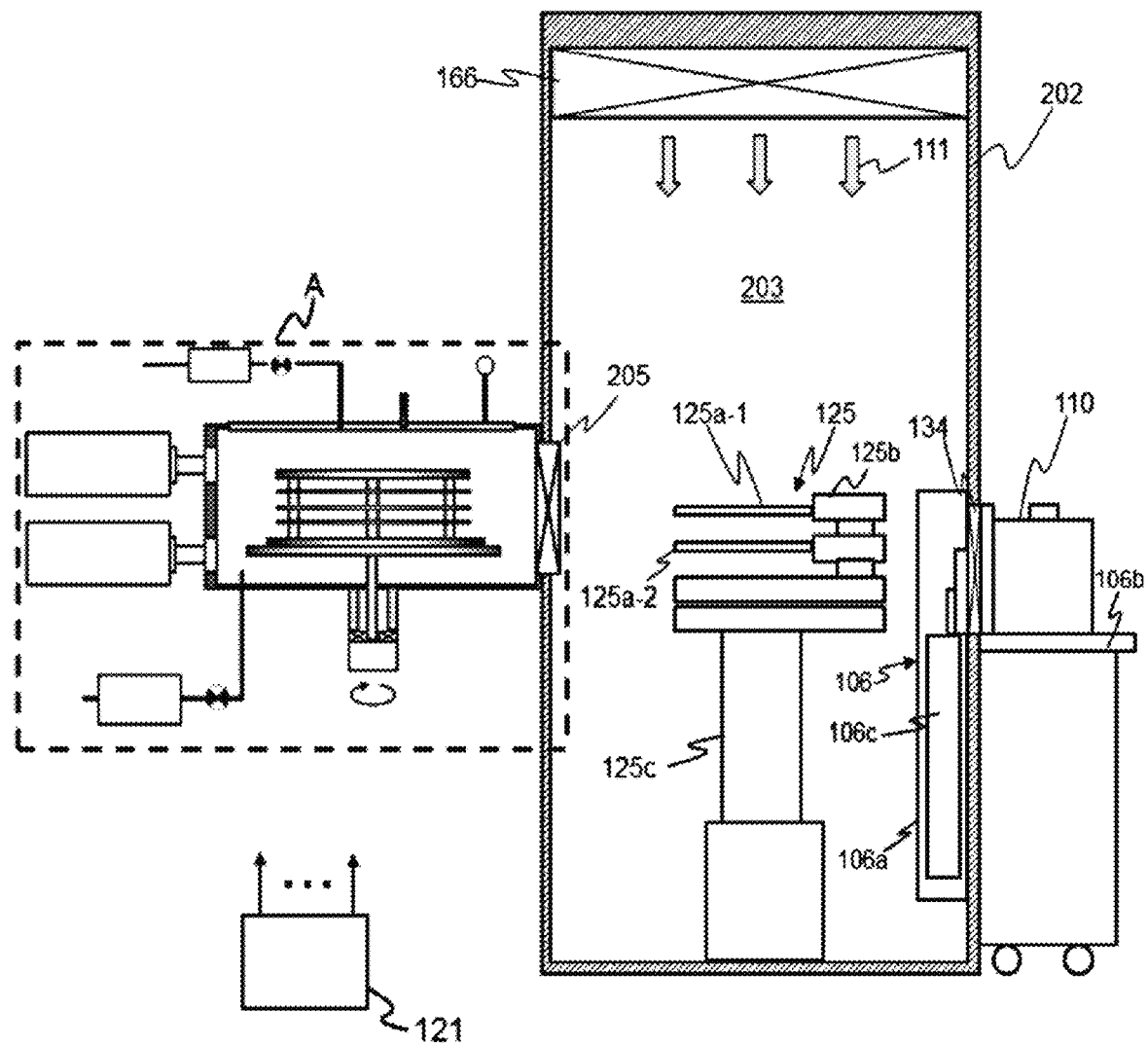
FIG. 1 is a vertical cross-sectional view showing a schematic configuration of a substrate processing apparatus suitably used in an embodiment of the present disclosure, which is seen at a position of a process furnace.
Figure 2:
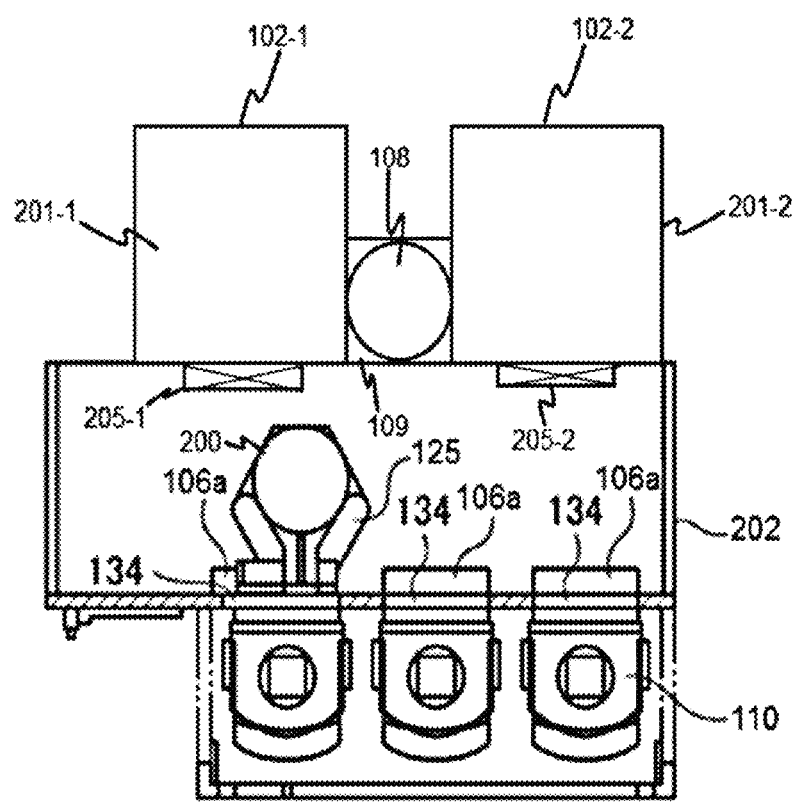
FIG. 2 is a horizontal cross-sectional view showing a schematic configuration of a substrate processing apparatus suitably used in an embodiment of the present disclosure.

As shown in FIGS. 1 and 2, the substrate processing apparatus 100 includes a transfer housing (housing) 202 including a transfer chamber (transfer area) 203 configured to transfer a wafer 200 therein, and cases 102-1 and 102-2 as process containers (to be described below) installed on a side wall of the transfer housing 202 and respectively including therein process chambers 201-1 and 201-2 configured to process the wafer 200. In addition, a cooling case (a cooling container or a cooling housing) 109 that forms a cooling chamber 204 (to be described below) is installed between the process chambers 201-1 and 201-2. A load port unit (LP) 106 as a pod opening/closing mechanism configured to open and close a lid of a pod 110 and transferring the wafer 200 to and from the transfer chamber 203 is arranged on the right side in FIG. 1 (the lower side in FIG. 2) as the front side of the housing of the transfer chamber 203. The load port unit 106 includes a housing 106a, a stage 106b and an opener 106c. The stage 106b is configured to mount the pod 110 thereon and to bring the pod 110 close to a substrate loading/unloading port 134 formed on the front side of the housing of the transfer chamber 203. A lid (not shown) installed on the pod 110 is opened and closed by the opener 106c. Further, the load port unit 106 may have a function capable of purging the inside of the pod 110 with a purge gas such as an $N_2$ gas or the like. In addition, the housing 202 includes a purge gas circulation structure (to be described below) configured to circulate a purge gas such as the $N_2$ or the like in the transfer chamber 203.

Gate valves (GV) 205-1 and 205-2 configured to open and close the process chambers 201-1 and 202-2 are respectively arranged on the left side in FIG. 1 (the upper side in FIG. 2) as the rear side of the housing 202 of the transfer chamber 203. A transfer machine 125 as a substrate transfer mechanism (a substrate transfer robot) configured to transfer the wafer 200 is installed in the transfer chamber 203. The transfer machine 125 includes tweezers (arms) 125a-1 and 125a-2 as mounting parts configured to mount the wafer 200, a transfer device 125b capable of horizontally rotating or directly moving each of the tweezers 125a-1 and 125a-2, and a transfer device elevator 125c that raises or lowers the transfer device 125b. By continuously operating the tweezers 125a-1 and 125a-2, the transfer device 125b, and the transfer device elevator 125c, the transfer machine 125 may charge or discharge the wafer 200 to and from a substrate holder 217 described below or the pod 110. Hereinafter, the cases 102-1 and 102-2, the process chambers 201-1 and 201-2, and the tweezers 125a-1 and 125a-2 will be simply referred to as a case 102, a chamber 201, and a tweezer 125a, respectively, unless it is necessary to specifically distinguish between them.

(Process Furnace)

Figure 3:
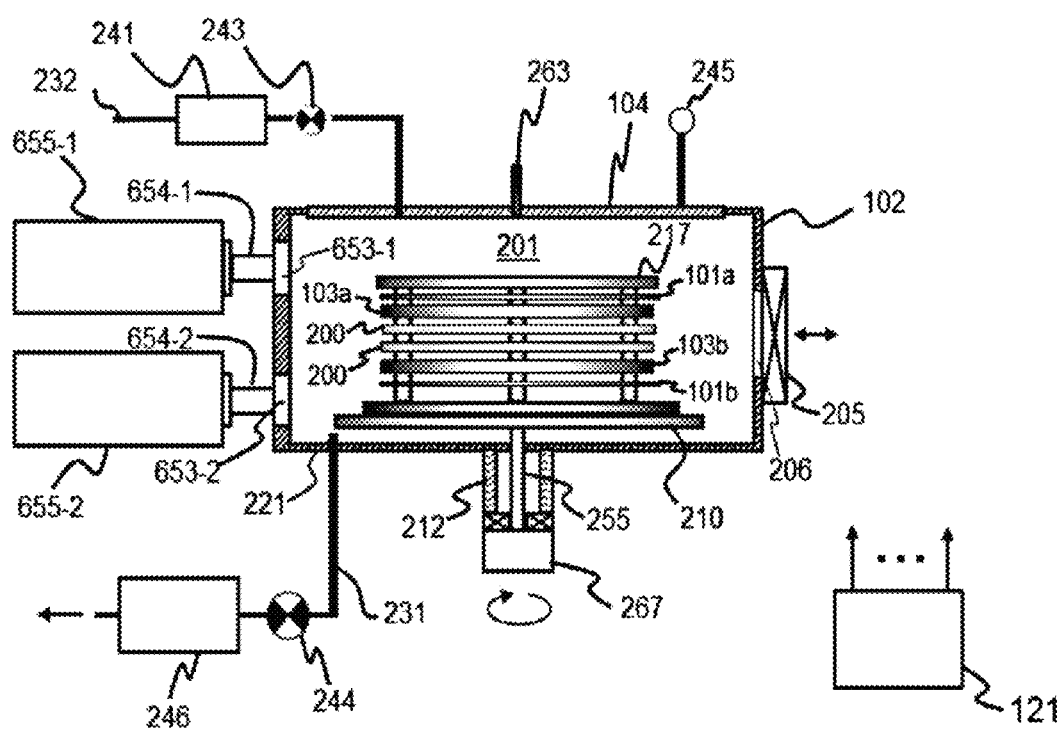
FIG. 3 is a vertical cross-sectional schematic configuration view showing a process furnace of a substrate processing apparatus suitably used in an embodiment of the present disclosure.

A process furnace having a substrate processing structure as shown in FIG. 3 is configured in the region A surrounded by a broken line in FIG. 1. As shown in FIG. 2, a plurality of process furnaces are installed in the present embodiment. Since the process furnaces have the same configuration, only one process furnace will be described, and the description of the other process furnace will be omitted. As shown in FIG. 3, the process furnace includes a case 102 as a cavity (process container) made of a material such as metal or the like that reflects an electromagnetic wave. Further, a cap flange (closing plate) 104 made of a metallic material is configured to close an upper end of the case 102 via an O-ring (not shown) as a sealing member (seal member). A space inside the case 102 and the cap flange 104 is mainly configured as a process chamber 201 configured to process a substrate such as a silicon wafer or the like. A reaction tube (not shown) made of quartz, which transmits an electromagnetic wave, may be provided inside the case 102, and the process container may be configured such that an inside of the reaction tube becomes a process chamber. In addition, the process chamber 201 may be configured using the case 102 having a closed ceiling without installing the cap flange 104.

A mounting stand 210 is installed in the process chamber 201, and a boat 217 as a substrate holder configured to hold wafers 200 as substrates is mounted on the upper surface of the mounting stand 210. The wafers 200 to be processed and quartz plates 101a and 101b as heat insulating plates arranged vertically above and below the wafers 200 so as to sandwich the wafers 200 are held by the boat 217 at predetermined intervals. In addition, for example, susceptors (also referred to as energy conversion members, radiating plates or soaking plates) 103a and 103b such as silicon plates (Si plates) or silicon carbide plates (SiC plates) formed of a dielectric material such as a dielectric body or the like, which is heated by absorbing an electromagnetic wave, and configured to indirectly heat the wafers 200 may be arranged between the quartz plates 101a and 101b and the wafers 200. With this configuration, the wafers 200 can be more efficiently and uniformly heated by the radiant heat from the susceptors 103a and 103b. In the present embodiment, the quartz plates 101a and 101b and the susceptors 103a and 103b are respectively formed of the same component. Hereinafter, when it is not necessary to specifically distinguish between them, the quartz plates 101a and 101b will be referred to as a quartz plate 101, and the susceptors 103a and 103b will be referred to as a susceptor 103.

The case 102 as a process container has, for example, a circular cross section, and is configured as a flat closed container. The transfer housing 202 as a lower container is made of, for example, a metallic material such as aluminum (Al) or stainless steel (SUS), quartz, or the like. The space surrounded by the case 102 may be referred to as a process chamber 201 or a reaction area 201 as a process space, and the space surrounded by the transfer housing 202 may be referred to as a transfer chamber 203 or a transfer area 203 as a transfer space. The process chamber 201 and the transfer chamber 203 are not limited to being adjacent to each other in the horizontal direction as in the present embodiment, but may be configured to be adjacent to each other in the vertical direction and raise or lower a substrate holder having a predetermined structure.

As shown in FIGS. 1, 2, and 3, a substrate loading/unloading port 206 adjacent to the gate valve 205 is provided at a side surface of the transfer housing 202. The wafer 200 is moved between the process chamber 201 and the transfer chamber 203 through the substrate loading/unloading port 206. In the vicinity of the gate valve 205 or the substrate loading/unloading port 206, a choke structure having a length equal to ¼ of the wavelength of the electromagnetic wave to be used is installed as a measure against leakage of the electromagnetic wave described below.

An electromagnetic wave supply part as a heating device, which will be described in detail below, is provided at the side surface of the case 102. An electromagnetic wave such as a microwave or the like supplied from the electromagnetic wave supply part is introduced into the process chamber 201 to heat the wafer 200 and the like, thereby processing the wafer 200.

The mounting stand 210 is supported by a shaft 255 as a rotating shaft. The shaft 255 penetrates a bottom portion of the transfer housing 202. Further, the shaft 255 is connected to a drive mechanism 267 that performs a rotating operation outside the transfer housing 202. By driving the drive mechanism 267 to rotate the shaft 255 and the mounting stand 210, it is possible to rotate the wafer 200 held on the boat 217. The periphery of the lower end portion of the shaft 255 is covered by a bellows 212, whereby the inside of the process chamber 201 and the transfer area 203 are kept airtight. The mounting stand 210 may be moved up or down by the drive mechanism 267 according to a height of the substrate loading/unloading port 206 so that the wafer 200 is located at a wafer transfer position when the wafer 200 is transferred. When the wafer 200 is processed, the wafer 200 may be moved up or down to a processing position (a wafer processing position) in the process chamber 201.

An exhaust part (or an exhauster) configured to exhaust an atmosphere in the process chamber 201 is installed below the process chamber 201 and on the outer peripheral side of the mounting stand 210. As shown in FIG. 1, an exhaust port 221 is provided at the exhaust part. An exhaust pipe 231 is connected to the exhaust port 221. A pressure regulator 244 such as an APC valve or the like configured to control a valve opening degree depending on a pressure in the process chamber 201, and a vacuum pump 246 are sequentially and serially connected to the exhaust pipe 231. In this regard, the pressure regulator 244 is not limited to the APC valve as long as it can receive pressure information in the process chamber 201 (a feedback signal from a pressure sensor 245 to be described below) and can adjust an exhaust amount. The pressure regulator 244 may be configured so as to use a typical opening/closing valve and a typical pressure regulation valve in combination.

An exhaust part or an exhauster (also referred to as an exhaust system or an exhaust line) mainly includes the exhaust port 221, the exhaust pipe 231 and the pressure regulator 244. An exhaust port may be provided to surround the mounting stand 210 so that a gas may be exhausted from the entire periphery of the wafer 200. In addition, the vacuum pump 246 may be added to the configuration of the exhaust part.

In the cap flange 104, there is installed a gas supply pipe 232 configured to supply process gases for various substrate processing processes, such as an inert gas, a precursor gas, a reaction gas and the like, into the process chamber 201. In the gas supply pipe 232, a mass flow controller (MFC) 241 which is a flow rate controller (flow rate control part) and a valve 243 which is an opening/closing valve are installed sequentially from the upstream side. For example, a nitrogen ($N_2$) gas source configured to supply a nitrogen ($N_2$) gas as an inert gas is connected to the upstream side of the gas supply pipe 232. The nitrogen ($N_2$) gas is supplied into the process chamber 201 via the MFC 241 and the valve 243. In the case of using plural kinds of gases at the time of substrate processing, the plural kinds of gases may be supplied by using a configuration in which a gas supply pipe having an MFC as a flow rate controller and a valve as an opening/closing valve installed sequentially from the upstream side is connected to the gas supply pipe 232 on the downstream side of the valve 243. A gas supply pipe provided with an MFC and a valve may be installed for each type of gas.

A gas supply system (a gas supply part or a gas supplier) mainly includes the gas supply pipe 232, the MFC 241 and the valve 243. When an inert gas is supplied to the gas supply system, the gas supply system is also referred to as an inert gas supply system. As the inert gas, in addition to the $N_2$ gas, it may be possible to use, for example, a rare gas such as an Ar gas, a He gas, a Ne gas, a Xe gas or the like.

On the cap flange 104, there is installed a temperature sensor 263 as a non-contact type temperature measurement device. By adjusting an output of a microwave oscillator 655 described below on the basis of the temperature information detected by the temperature sensor 263, it is possible to heat the substrate such that the substrate has a desired temperature distribution. The temperature sensor 263 includes, for example, a radiation thermometer such as an IR (Infrared Radiation) sensor or the like. The temperature sensor 263 is provided so as to measure surface temperature of the quartz plate 101a or surface temperature of the wafer 200. In the case where the susceptor described above as a heating element is installed, the temperature sensor 263 may be configured to measure surface temperature of the susceptor. When a temperature of the wafer 200 (wafer temperature) is referred to in the present disclosure, it may mean wafer temperature converted by temperature conversion data described below, that is, an estimated wafer temperature, a temperature obtained by directly measuring the temperature of the wafer 200 with the temperature sensor 263, or both.

The temperature sensor 263 acquires in advance a transition of temperature change for each of the quartz plate 101 or the susceptor 103 and the wafer 200, whereby the temperature conversion data indicating a correlation between the temperature of the quartz plate 101 or the susceptor 103 and the temperature of the wafer 200 may be stored in a memory device 121c or an external memory device 123. By preparing in advance the temperature conversion data as described above, the temperature of the wafer 200 can be estimated merely by measuring the temperature of the quartz plate 101. Based on the estimated temperature of the wafer 200, the output of the microwave oscillator 655, that is, the heating device can be controlled.

The measuring means that measures the temperature of a substrate is not limited to the above-described radiation thermometer. The temperature measurement may be performed by using a thermocouple or may be performed by using both a thermocouple and a non-contact type thermometer. However, when temperature measurement is performed using the thermocouple, it is necessary to arrange the thermocouple near the wafer 200 to perform temperature measurement. That is, it is necessary to arrange the thermocouple in the process chamber 201. Therefore, the thermocouple itself may heated by the microwave supplied from the microwave oscillator described below. This makes it impossible to accurately measure the temperature. Accordingly, the non-contact type thermometer may be as the temperature sensor 263 in some embodiments. Further, the temperature sensor 263 is not limited to being installed on the cap flange 104, but may be installed on the mounting stand 210. Further, the temperature sensor 263 may not only be directly installed on the cap flange 104 or the mounting stand 210 but also may be configured to indirectly measure the temperature by reflecting radiation light from a measurement window installed in the cap flange 104 or the mounting stand 210 through the use of a mirror or the like. In addition, the present disclosure is not limited to installing one temperature sensor 263. A plurality of temperature sensors may be installed.

Electromagnetic wave introduction ports 653-1 and 653-2 are provided at the side wall of the case 102. One end of each of waveguides 654-1 and 654-2 configured to supply an electromagnetic wave (microwave) into the process chamber 201 is connected to each of the electromagnetic wave introduction ports 653-1 and 653-2. The other ends of the waveguides 654-1 and 654-2 are connected to microwave oscillators (electromagnetic wave sources) 655-1 and 655-2 as heat sources configured to supply an electromagnetic wave into the process chamber 201 and heating the inside of the process chamber 201. The microwave oscillators 655-1 and 655-2 supply an electromagnetic wave such as a microwave or the like to the waveguides 654-1 and 654-2, respectively. As the microwave oscillators 655-1 and 655-2, a magnetron, a klystron or the like is used. Hereinafter, the electromagnetic wave introduction ports 653-1 and 653-2, the waveguides 654-1 and 654-2, and the microwave oscillators 655-1 and 655-2 will be referred to as an electromagnetic wave introduction port 653, a waveguide 654 and a microwave oscillator 655, respectively, when it is not necessary to specifically distinguish between them.

A frequency of the electromagnetic wave generated by the microwave oscillator 655 may be controlled so as to fall within a frequency range of from 13.56 MHz to 24.125 GHz in some embodiments. Further, the frequency of the electromagnetic wave may be controlled to become a frequency of 2.45 GHz or 5.8 GHz in some embodiments. In this regard, the frequencies of the microwave oscillators 655-1 and 655-2 may be the same or may be different. In the present embodiment, two microwave oscillators 655 are arranged on the side surface of the case 102, but the present disclosure is not limited thereto. One or more microwave oscillators 655 may be provided. In addition, the microwave oscillators 655 may be installed on different side surfaces such as opposing side surfaces of the case 102 and the like. An electromagnetic wave supply part (also referred to as electromagnetic wave supply device, microwave supply part, or microwave supply device) as a heating device mainly includes the microwave oscillators 655-1 and 655-2, the waveguides 654-1 and 654-2, and the electromagnetic wave introduction ports 653-1 and 653-2.

A controller 121 to be described below is connected to each of the microwave oscillators 655-1 and 655-2. The temperature sensor 263 configured to measure the temperature of the quartz plate 101a or 101b or the wafer 200 accommodated in the process chamber 201 is connected to the controller 121. The temperature sensor 263 measures the temperature of the quartz plate 101 or the wafer 200 according to the above-described method and transmits the measured temperature to the controller 121. The controller 121 controls the output of the microwave oscillators 655-1 and 655-2, thereby controlling the heating of the wafer 200. As the method of controlling the heating performed by the heating device, it may be possible to use a method of controlling the heating of the wafer 200 by controlling the voltage inputted to the microwave oscillator 655, a method of controlling the heating of the wafer 200 by changing a ratio of a time to turn on the power supply of the microwave oscillator 655 and the time to turn off the power supply of the microwave oscillator 655, and the like.

In this regard, the microwave oscillators 655-1 and 655-2 are controlled by the same control signal transmitted from the controller 121. However, the present disclosure is not limited thereto. The microwave oscillators 655-1 and 655-2 may be individually controlled by transmitting individual control signals from the controller 121 to the microwave oscillators 655-1 and 655-2.

(Cooling Chamber)

Figure 4:
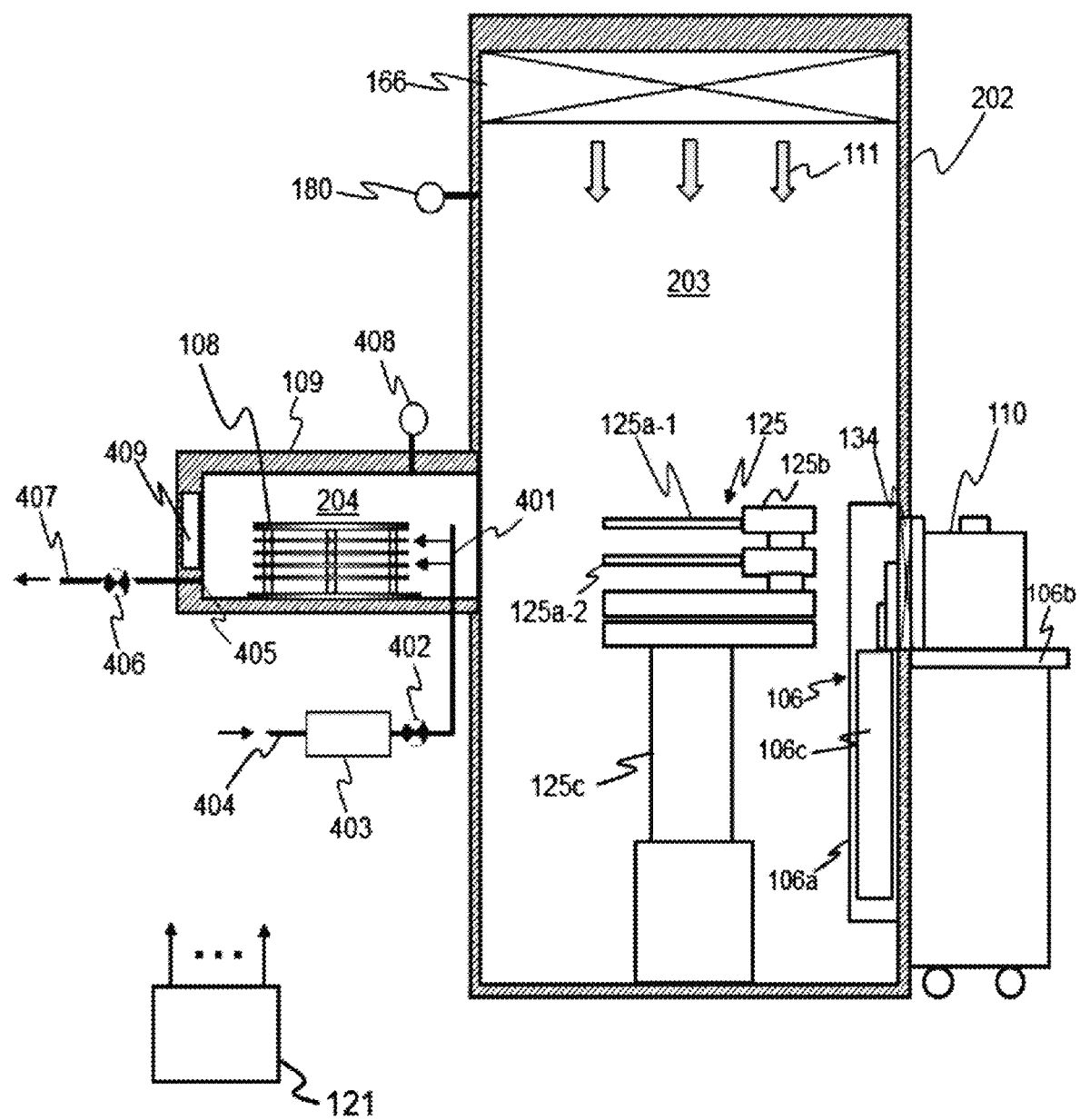
FIG. 4 is a vertical cross-sectional view showing a schematic configuration of a substrate processing apparatus suitably used in an embodiment of the present disclosure, which is seen at a position of a cooling chamber.
Figure 5A:
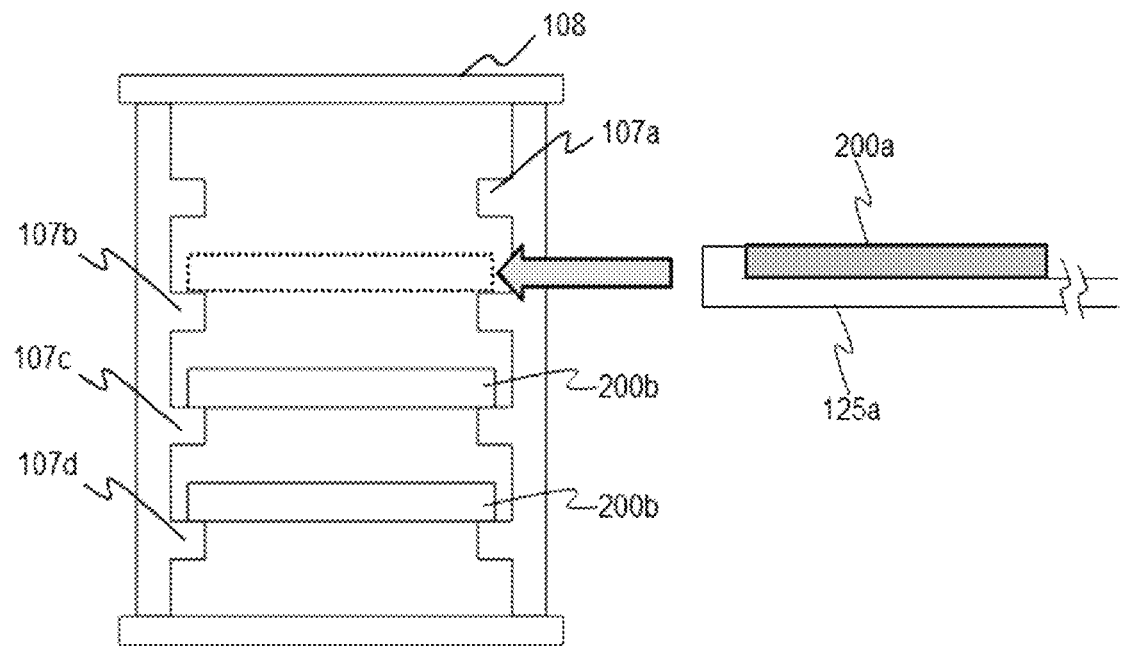
FIG. 5A is a view schematically showing a method of transferring a wafer to a cooling chamber.
Figure 5B:
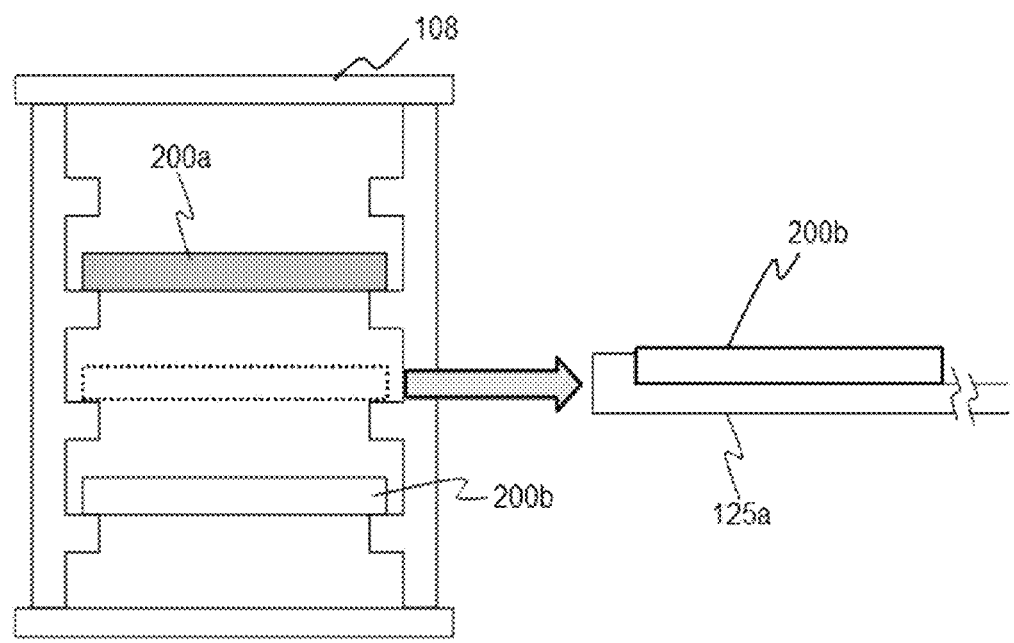
FIG. 5B is a view schematically showing a method of unloading a cooled wafer from the cooling chamber.

As shown in FIGS. 2 and 4, a cooling chamber (also referred to as a cooling area or a cooling part) 204 as a cooling region configured to cool the wafer 200 subjected to a predetermined substrate processing process is formed by the cooling case 109 on the lateral side of the transfer chamber 203 between the process chambers 201-1 and 201-2 at a position substantially equidistant from the process chambers 201-1 and 201-2, more specifically, so that transfer distances of the substrate loading/unloading ports 206 of the process chambers 201-1 and 201-2 are substantially equal to each other. Inside the cooling chamber 204, there is installed a wafer cooling mounting device (also referred to as a cooling stage and hereinafter referred to as CS) 108 having a structure similar to that of the boat 217 as a substrate holder. The CS 108 is configured such that a plurality of wafers 200 can be horizontally held in multiple stages along a vertical direction by a plurality of wafer holding grooves 107a to 107d as shown in FIGS. 5A and 5B described below. In the cooling case 109, there is installed a gas supply nozzle (cooling chamber gas supply nozzle) 401 as a cooling chamber purge gas supply part that supplies, at a predetermined first flow rate, an inert gas as a purge gas (cooling chamber purge gas) that purges the atmosphere in the cooling chamber 204 via a gas supply pipe (cooling chamber gas supply pipe) 404. The gas supply nozzle 401 may be an open nozzle having an opened nozzle end. Further, the gas supply nozzle 401 may be a porous nozzle having a plurality of gas supply holes on a nozzle side wall facing the CS 108 in some embodiments. A plurality of gas supply nozzles 401 may be installed. The purge gas supplied from the gas supply nozzle 401 may be used as a cooling gas that cools the processed wafer 200 held on the CS 108.

Furthermore, in the cooling chamber 204, there are installed an exhaust port 405 configured to exhaust the cooling chamber purge gas, an opening/closing valve (or APC valve) 406 as a cooling chamber exhaust valve configured to adjust an gas exhaust amount, and an exhaust pipe 407 as a cooling chamber exhaust pipe. A cooling chamber vacuum pump (not shown) configured to positively exhaust the atmosphere in the cooling chamber 204 may be provided at the exhaust pipe 407 on the downstream side of the opening/closing valve 406. The exhaust pipe 407 may be connected to a purge gas circulation structure configured to circulate the atmosphere in the transfer chamber 203 described below. In this case, the exhaust pipe 407 may be connected to a circulation path 168A shown in FIG. 6 described below in some embodiments. Further, the exhaust pipe 407 may be connected (joined) to an upstream position immediately before the clean unit 166 and on the downstream side of the circulation path 168A.

Further, in the cooling case 109, there is installed a cooling chamber pressure sensor (cooling chamber pressure gauge) 408 configured to detect the pressure in the cooling chamber 204. The controller 121 described below controls the MFC 403 as a cooling chamber MFC and the valve 402 as a cooling chamber valve to supply the purge gas or stop supplying the purge gas so that the differential pressure between the pressure in the transfer chamber 203 detected by a transfer chamber pressure sensor (transfer chamber pressure gauge) 180 and the pressure in the cooling chamber 204 is kept constant. Further, the controller 121 controls the opening/closing valve 406 and the cooling chamber vacuum pump to control the exhaust or the stop of the exhaust of the purge gas. The pressure in the cooling chamber 204 and the temperature of the wafer 200 held on the CS 108 are controlled by these controls. A cooling chamber gas supply system (a first gas supplier) mainly includes the gas supply nozzle 401, the valve 402, the MFC 403 and the gas supply pipe 404. A cooling chamber gas exhaust system (cooling chamber gas exhaust part) mainly includes the exhaust port 405, the opening/closing valve 406 and the exhaust pipe 407. A cooling chamber vacuum pump may be included in the cooling chamber gas exhaust system. In the cooling chamber 204, there may be installed a temperature sensor (not shown) configured to measure the temperature of the wafer 200 held on the CS 108. The wafer holding grooves 107a to 107d will be simply referred to as a wafer holding groove 107 when it is not necessary to specifically distinguish between them.

(Purge Gas Circulation Structure)

Figure 6:
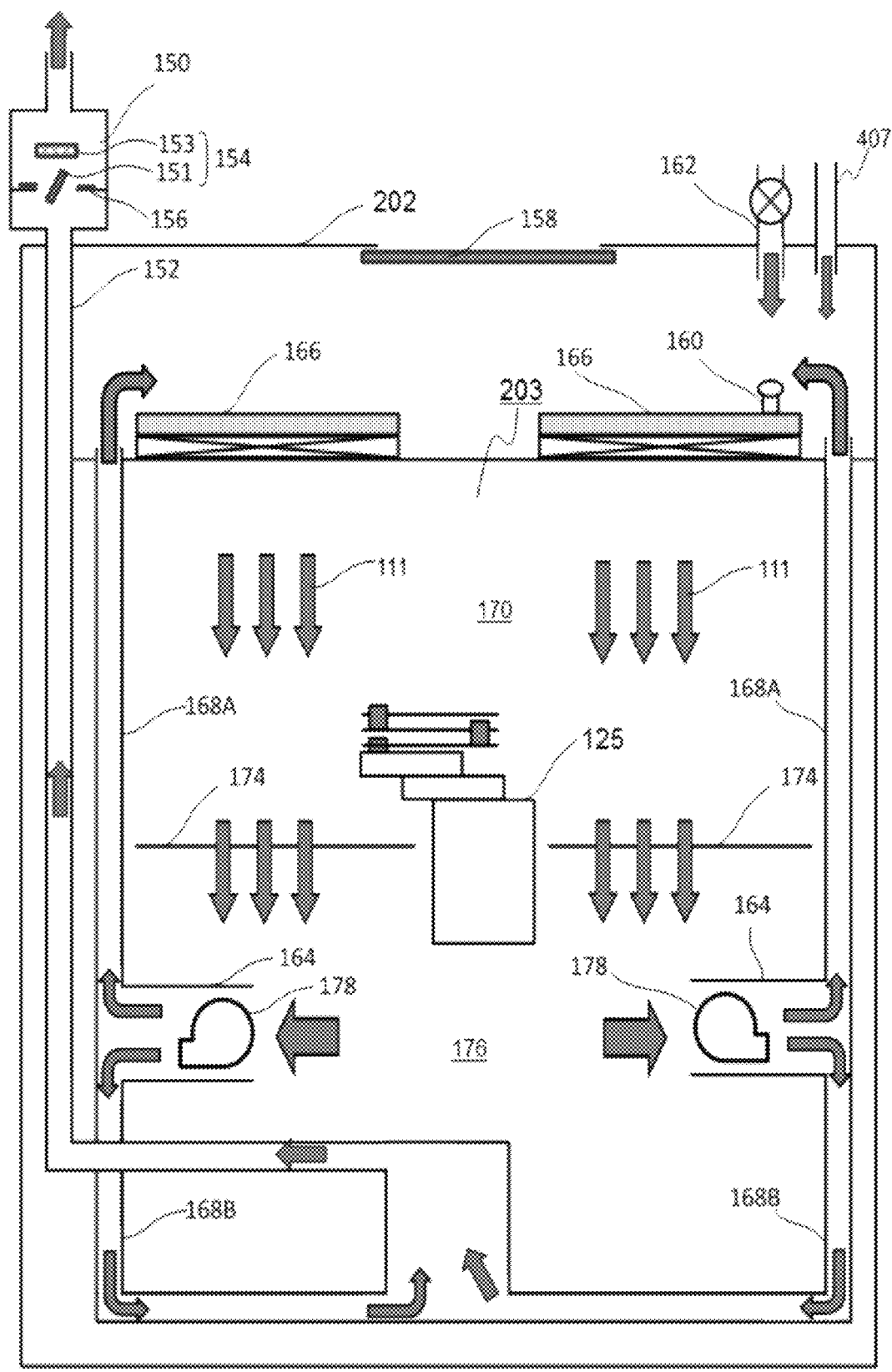
FIG. 6 is a view showing a purge gas circulation structure of a transfer chamber suitably used in an embodiment of the present disclosure.

Next, the purge gas circulation structure installed in the transfer chamber 203 of the present embodiment will be described with reference to FIGS. 1 and 6. As shown in FIG. 6, the transfer chamber 203 includes a purge gas supply mechanism (a second gas supplier) 162 configured to supply an inert gas or an air (fresh air) as a purge gas at a predetermined second gas flow rate into a duct formed around the transfer chamber 203, and a pressure control mechanism 150 configured to control the pressure in the transfer chamber 203. The purge gas supply mechanism 162 is configured to supply a purge gas into the duct mainly according to a value detected by a detector 160 that detects an oxygen concentration in the transfer chamber 203. The detector 160 is disposed above (on the upstream side of) a clean unit 166 as a gas supply mechanism that removes dust or impurities and supplies a purge gas into the transfer chamber 203. The clean unit 166 includes a filter configured to remove dust or impurities and a blower (fan) configured to blow the purge gas. The oxygen concentration in the transfer chamber 203 can be controlled by the purge gas supply mechanism 162 and the pressure control mechanism 150. The detector 160 may be configured to detect a moisture concentration in addition to the oxygen concentration.

The pressure control mechanism 150 includes an adjustment damper 154 configured to maintain the inside of the transfer chamber 203 at a predetermined pressure, and an exhaust damper 156 configured to fully open or fully close the exhaust path 152. The adjustment damper 154 includes an automatic damper (back pressure valve) 151 configured to be opened when the pressure in the transfer chamber 203 becomes higher than a predetermined pressure, and a press damper 153 configured to control the opening and closing of the automatic damper 151. By controlling the opening and closing of the adjustment damper 154 and the exhaust damper 156 in this manner, the inside of the transfer chamber 203 can be controlled to an arbitrary pressure.

As shown in FIG. 6, on a ceiling of the transfer chamber 203, clean units 166 are respectively arranged on the left and right sides of the ceiling. A porous plate 174, which is a distributing plate configured to regulate the flow of the purge gas, is installed around the transfer machine 125. The porous plate 174 has a plurality of holes, and is formed by, for example, a punching panel. By installing the porous plate 174, the space in the transfer chamber 203 is divided into a first space 170 as an upper space and a second space 176 as a lower space. That is, the first space 170, which is a wafer transfer area, is formed in a space between the ceiling and the porous plate 174. The second space 176, which is a gas exhaust area, is formed in a space between the porous plate 174 and a floor of the transfer chamber 203.

In the lower portion of the second space 176 below the transfer chamber 203, suction parts 164 configured to circulate and exhaust the purge gas flowing in the transfer chamber 203 are respectively disposed on the left and right sides of the transfer machine 125 sandwiched therebetween. Further, a path 168 as a circulation path and an exhaust path connecting the pair of left and right suction parts 164 and the pair of left and right clean units 166 is formed inside a wall surface of the housing 202. i.e., between an outer wall surface and an inner wall surface of the housing 202. 168. A cooling mechanism (radiator) (not shown) configured to cool a fluid is installed in the path 168, which makes it possible to control the temperature of the circulating purge gas.

The path 168 is branched into two paths, i.e., a circulation path 168A and an exhaust path 168B. The circulation path 168A is a flow path connected to the upstream side of the clean unit 166 to supply the purge gas into the transfer chamber 203 again. The exhaust path 168B is a flow path connected to the pressure control mechanism 150 to exhaust the purge gas. The exhaust paths 168B provided at the left and right sides of the housing 202 are joined to one external exhaust path 152 on the downstream side.

Next, the flow of the gas in the transfer chamber 203 will be described. The arrows shown in FIG. 6 schematically show the flow of the purge gas supplied from the purge gas supply mechanism 162. For example, when introducing an $N_2$ gas (inert gas) as a purge gas into the transfer chamber 203, the $N_2$ gas is supplied into the transfer chamber 203 from the ceiling of the transfer chamber 203 via the clean unit 166 to form a down-flow 111 in the transfer chamber 203. In the transfer chamber 203, the porous plate 174 is installed to divide the space in the transfer chamber 203 into the first space 170, which is an area where the wafer 200 is mainly transferred, and the second space 176, in which particles easily settle, whereby there is provided a structure configured to generate a differential pressure between the first space 170 and the second space 176. At this time, a pressure in the first space 170 is higher than a pressure in the second space 176. With such a configuration, it is possible to prevent particles generated in the drive parts such as the transfer device elevator 125c and the like below the tweezers 125a from scattering into the wafer transfer area. Further, it is possible to prevent particles on the floor of the transfer chamber 203 from swirling up into the first space 170.

The $N_2$ gas supplied to the second space 176 by the down-flow 111 is sucked out of the transfer chamber 203 by the suction part 164. The $N_2$ gas sucked out of the transfer chamber 203 is divisionally introduced into two flow paths, the circulation path 168A and the exhaust path 168B, on the downstream side of the suction part 164. The $N_2$ gas introduced into the circulation path 168A flows toward the upper portion of the housing 202, and circulates through the transfer chamber 203 via the clean unit 166. Further, the $N_2$ gas introduced into the exhaust path 168B flows toward the lower portion of the housing 202, and is exhausted to the outside from the external exhaust path 152. When the conductance of the circulation path 168A is small, fans 178 as blowers that promote the circulation of the $N_2$ gas may be installed in the left and right suction parts 164. By installing the fans 178, the flow of the $N_2$ gas can be improved, and the circulating air flow can be easily formed. By circulating and exhausting the air through two separate systems on left and right sides in this manner, a uniform air flow can be formed in the transfer chamber 203.

The circulation or non-circulation of the $N_2$ gas in the transfer chamber 203 may be enabled by controlling the opening and closing of the adjustment damper 154 and the exhaust damper 156. That is, when circulating the $N_2$ gas in the transfer chamber 203, the automatic damper 151 and the press damper 153 are opened and the exhaust damper 156 is closed so that a circulating air flow can be easily formed in the transfer chamber 203. In this case, the $N_2$ gas introduced into the exhaust path 168B may be retained in the exhaust path 168B, or may be allowed to flow through the circulation path 168A.

The pressure in the pod 110, the pressure in the transfer chamber 203, the pressure in the process chamber 201 and the pressure in the cooling chamber 204 are all controlled by the controller 121 so as to be kept at the atmospheric pressure or at a high pressure of about 10 Pa to 200 Pa (gauge pressure) below the atmospheric pressure. In each of an in-furnace pressure/temperature adjustment step S803 described below, an inert gas supply step S804 and a modifying step S805, the pressure in the transfer chamber 203 may be controlled to be higher than the pressures in the process chamber 201 and the cooling chamber 204 or the pressure in the process chamber 201 may be controlled to be higher than the pressure in the pod 110 in some embodiments. In each of the substrate loading step S802, the substrate unloading step S806 and the substrate cooling step S807, the pressure in the chamber 203 may be controlled to be lower than the pressure in the process chamber 201 and higher than the pressure in the cooling chamber 204 in some embodiments.

(Control Device)

Figure 7:
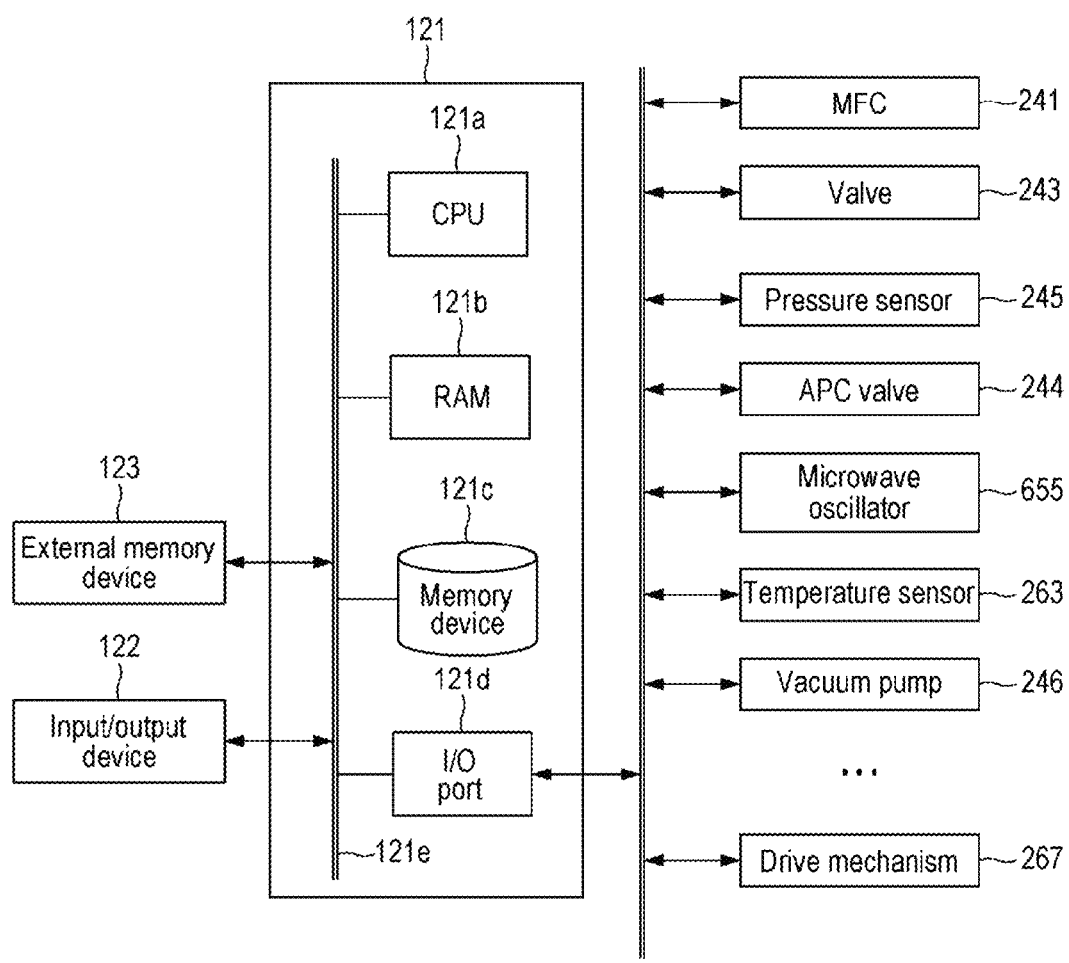
FIG. 7 is a schematic configuration view of a controller of a substrate processing apparatus suitably used in an embodiment of the present disclosure.

As shown in FIG. 7, the controller 121 as a control part (control device or control means) is configured as a computer including a CPU (Central Processing Unit) 121a, a RAM (Random Access Memory) 121b, a memory device 121c and an I/O port 121d. The RAM 121b, the memory device 121c, and the I/O port 121d are configured to exchange data with the CPU 121a via an internal bus 121e. An input/output device 122 including, for example, a touch panel or the like is connected to the controller 121.

The memory device 121c includes, for example, a flash memory, a hard disc drive (HDD), or the like. A control program that controls operations of the substrate processing apparatus, a process recipe in which sequences, conditions, and the like of an annealing (modifying) process are written, and the like are readably stored in the memory device 121c. The process recipe is a combination that allows the controller 121 to execute each procedure in a substrate processing process described below to obtain a predetermined result. The process recipe functions as a program. Hereinafter, the process recipe and the control program will be generally and simply referred to as a "program." Further, the process recipe is simply referred to as a "recipe." When the term "program" is used herein, it may indicate a case of including only the process recipe, a case of including only the control program, or a case of including both the process recipe and the control program. The RAM 121b is configured as a memory area (work area) in which a program read by the CPU 121a, data or the like is temporarily held.

The I/O port 121d is connected to the MFC 241, the valve 243, the pressure sensor 245, the APC valve 244, the vacuum pump 246, the temperature sensor 263, the drive mechanism 267, the microwave oscillator 655, and the like.

The CPU 121a is configured to read the control program from the memory device 121c and execute the same. The CPU 121a is also configured to read the process recipe from the memory device 121c in response to an input of an operation command from the input/output device 122, and the like. The CPU 121a is configured to control, according to contents of the process recipe thus read, a flow rate adjustment operation of various gases performed by the MFC 241, an opening/closing operation of the valve 243, a pressure regulation operation performed by the APC valve 244 based on the pressure sensor 245, startup and stop of the vacuum pump 246, an output adjustment operation of the microwave oscillator 655 based on the temperature sensor 263, rotation, rotation speed adjustment or raising/lowering operations of the mounting stand 210 (or the boat 217) performed by the drive mechanism 267, and the like.

The controller 121 may be configured by installing, in a computer, the above-described program stored in an external memory device (e.g., a magnetic disk such as a hard disk or the like, an optical disk such as a CD or the like, a magneto-optical disk such as an MO or the like, or a semiconductor memory such as a USB memory or the like) 123. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The provision of the program to the computer may be performed by using a communication means such as the Internet or a dedicated line without using the external memory device 123.

(2) Substrate Processing Process

Next, a process of manufacturing a semiconductor device using a process furnace of the above-described substrate processing apparatus 100, for example, an example of a method of modifying (crystallizing) an amorphous silicon film as a silicon-containing film formed on a substrate will be described with reference to a process flow shown in FIG. 8. In the following description, operations of the respective parts constituting the substrate processing apparatus 100 are controlled by the controller 121. Similar to the process furnace structure described above, in the substrate processing process according to the present embodiment, the same processing content, that is, the same recipe is used in a plurality of process furnaces. Therefore, the substrate processing process performed using one process furnace will be described, and the description of the substrate processing process performed using the other process furnaces will be omitted.

When the term "wafer" is used herein, it may refer to "a wafer itself" or "a laminated body of a wafer and a predetermined layer or film formed on a surface of the wafer." Further, when the phrase "a surface of a wafer" is used herein, it may refer to "a surface of a wafer itself" or "a surface of a predetermined layer or the like formed on a wafer." Further, the expression "a predetermined layer is formed on a wafer" as used herein may mean that "a predetermined layer is directly formed on a surface of a wafer itself" or that "a predetermined layer is formed on a layer or the like formed on a wafer." When the term "substrate" is used herein, it may be synonymous with the term "wafer."

(Substrate Taking-Out Step (S801))

As shown in FIG. 1, the transfer machine 125 takes out a predetermined number of wafers 200 to be processed from the pod 110 opened by the load port unit 106, and mounts the wafers 200 on one or both of the tweezers 125a-1 and 125a-2.

(Substrate Loading Step (S802))

As shown in FIG. 3, the wafer 200 held on one or both of the tweezers 125a-1 and 125a-2 is loaded into a predetermined process chamber 201 by opening and closing the gate valve 205 (boat loading) (S802).

(In-Furnace Pressure Regulation/Temperature Adjustment Step (S803))

After the loading of the boat 217 into the process chamber 201 is completed, the atmosphere in the process chamber 201 is controlled so that the pressure in the process chamber 201 becomes a predetermined pressure (for example, 10 to 102,000 Pa). Specifically, while performing evacuation by the vacuum pump 246, the valve opening degree of the pressure regulator 244 is feedback-controlled based on the pressure information detected by the pressure sensor 245 so that the pressure in the process chamber 201 is set to a predetermined pressure. At the same time, the electromagnetic wave supply part may be controlled to perform preheating and may be controlled to perform heating to a predetermined temperature (S803). When the temperature rises to a predetermined substrate processing temperature by the electromagnetic wave supply part, the temperature rising may be performed by an output smaller than an output of a modifying step described below so that the wafer 200 is not deformed or broken. In the case where a substrate processing process is performed under an atmospheric pressure, after only the in-furnace temperature is adjusted without regulating the in-furnace pressure, the process may be controlled so as to proceed to an inert gas supply step S804 to be described later.

(Inert Gas Supply Step (S804))

When the pressure and the temperature in the process chamber 201 are controlled to predetermined values in the in-furnace pressure regulation/temperature adjustment step S803, the drive mechanism 267 rotates the shaft 255 and rotates the wafer 200 via the boat 217 on the mounting stand 210. At this time, an inert gas such as a nitrogen gas or the like is supplied through the gas supply pipe 232 (S804). Further, at this time, the pressure in the process chamber 201 is regulated to a predetermined value falling within a range of 10 Pa to 102000 Pa, for example, 101300 Pa or more and 101650 Pa or less. The shaft 255 may be rotated during the substrate loading step S802, i.e., after the wafer 200 has been loaded into the process chamber 201.

(Modifying Step (S805))

When the interior of the process chamber 201 is maintained at a predetermined pressure, the microwave oscillator 655 supplies a microwave into the process chamber 201 via the above-described respective parts. By supplying the microwave into the process chamber 201, the wafer 200 is heated to a temperature of 100 degrees C. or more and 1000 degrees C. or less, 400 degrees C. or more and 900 degrees C. or less, or 500 degrees C. or more and 700 degrees C. or less in some embodiments. By performing the substrate processing process at such a temperature, the substrate is processed under the temperature at which the wafer 200 efficiently absorbs the microwave. This makes it possible to increase a speed of the modifying step. In other words, in the case that the wafer 200 is processed at a temperature lower than 100 degrees C. or higher than 1000 degrees C., the surface of the wafer 200 may be degraded and be difficult to absorb the microwave. Therefore, it becomes difficult to heat the wafer 200. Accordingly, the substrate processing process may be performed in the above-described temperature range in some embodiments.

In the present embodiment in which heating is performed by the microwave heating method, a standing wave is generated in the process chamber 201. On the wafer 200 (the susceptor 103 in the case where the susceptor 103 is placed), there are generated a locally-heated concentrated heating region (hot spot) and a remaining unheated region (non-heating region). In order to suppress deformation of the wafer 200 (the susceptor 103 in the case where the susceptor 103 is placed), the on/off operation of the power supply of the electromagnetic wave supply part may be controlled to suppress generation of a hot spot on the wafer 200. At this time, it is also possible to suppress the deformation of the wafer 200 by controlling the supply power of the electromagnetic wave supply part to a low output so as to reduce an influence of the hot spot. However, in this case, the energy applied to the wafer 200 or the susceptor 103 becomes small. Therefore, the temperature rising also becomes small, which makes it necessary to lengthen the heating time.

As described above, the temperature sensor 263 is a non-contact type temperature sensor. In the case that deformation or breakage occurs in the wafer 200 as a measurement target (the susceptor 103 when the susceptor 103 is placed), a position of the wafer 200 monitored by the temperature sensor 263 and a measurement angle with respect to the wafer 200 are changed. Therefore, a measurement value (a monitoring value) may become inaccurate and the measurement temperature may be changed rapidly. In the present embodiment, a sudden change in a measurement temperature of a radiation thermometer due to such deformation or breakage of the measurement target is used as a trigger configured to turn on and off the electromagnetic wave supply part.

By controlling the microwave oscillator 655 as described above, the wafer 200 is heated, and the amorphous silicon film formed on the surface of the wafer 200 is modified (crystallized) into a polysilicon film (S805). That is, it becomes possible to uniformly modify the wafer 200. In the case where the measured temperature of the wafer 200 becomes higher or lower than the above-mentioned threshold value, the output of the microwave oscillator 655 may be lowered without turning off the microwave oscillator 655, whereby the temperature of the wafer 200 may be set to fall within a predetermined range. In this case, when the temperature of the wafer 200 returns to the temperature falling within the predetermined range, the output of the microwave oscillator 655 is controlled to increase.

When a preset processing time has elapsed, the rotation of the boat 217, the supply of the gas, the supply of the microwave and the exhaust through the exhaust pipe are stopped.

(Substrate Unloading Step (S806))

After the pressure in the process chamber 201 is returned to the atmospheric pressure, the gate valve 205 is opened to allow the process chamber 201 and the transfer chamber 203 to spatially communicate with each other. Thereafter, the wafer 200 held on the boat is unloaded to the transfer chamber 203 by the tweezers 125a of the transfer machine 125 (S806).

(Substrate Cooling Step (S807))

The wafer 200 unloaded by the tweezers 125a is moved to the cooling chamber 204 by continuous operation of the transfer device 125b and the transfer device elevator 125c, and is held on the CS 108 by the tweezers 125a. Specifically, as shown in FIG. 5A, the wafer 200a subjected to the modifying step S805 and held by the tweezer 125a-1 is transferred to a wafer holding groove 107b formed in the CS 108, and is held for a predetermined time, so that the wafer 200a is cooled (S807). At this time, when the cooled wafer 200b which has already been cooled is held in the CS 108 as shown in FIG. 5B, the tweezer 125a-1 which have transferred the wafer 200a subjected to the modifying process S805 in the wafer holding groove 107b, or another empty tweezers (e.g., the tweezer 125a-2) transfer the cooled wafer 200b to the load port, i.e., the pod 110.

(Substrate Storage Step (S808))

The wafer 200 cooled in the substrate cooling step S807 is unloaded from the CS 108 by the tweezers 125a and is transferred to a predetermined pod 110 (S808).

By repeating the above operation, the wafer 200 is modified and moved to the next substrate processing process. Although there has been described the configuration in which the substrate processing process is performed by mounting two wafers 200 on the boat 217, the present disclosure is not limited thereto. The wafers 200 may be held, one by one, on the boats 217 installed in the process chambers 201-1 and 201-2 and may be subjected to the same process. By performing a swap process, two wafers 200 may be processed in the process chambers 201-1 and 201-2. At this time, the transfer destination of the wafer 200 may be controlled so that the numbers of times of the substrate processing process performed in the respective process chambers 201-1 and 201-2 are matched with each other. By performing such control, the numbers of times of the substrate processing process performed in the respective process chambers 201-1 and 201-2 become constant, which makes it possible to efficiently perform a work such as maintenance or the like. For example, when the process chamber to which the wafer 200 has been previously transferred is the process chamber 201-1, control is performed such that the transfer destination of the next wafer 200 becomes the process chamber 201-2, which makes it possible to control the numbers of times of the substrate processing process performed in the respective process chambers 201-1 and 201-2.

Further, the tweezers 125a-1 and 125a-2 may be installed so as to serve as a high-temperature tweezer configured to transfer the wafer 200 heated to a high temperature due to the substrate processing process and a low-temperature tweezer configured to transfer the wafer 200 having a temperature other than the high temperature, respectively. For example, by using the tweezer 125a-1 as the high-temperature tweezer and using the tweezer 125a-2 as the low-temperature tweezer, the wafer 200 heated to a high temperature in the modifying step S805 may be transferred to the cooling chamber 204 using only the tweezer 125a-1. At a transfer timing other than when unloading the wafer 200 from the process chamber 201, the wafer 200 may be transferred by the tweezer 125a-2.

(3) Control of Pressure in Cooling Chamber

Next, the control of the pressure in the cooling chamber 204 will be described with reference to FIGS. 9A and 9B. In the following description, operations of the respective parts are controlled by the controller 121 as in the substrate processing process. As shown in FIG. 4, a partition such as the gate valve 205 or the like that spatially separates the process chamber 201 and the transfer chamber 203 from each other is not disposed in the cooling chamber 204 according to the present embodiment. Therefore, the flow of the purge gas flowing in the transfer chamber 203 may be changed depending on the pressure in the cooling chamber 204. The change in the gas flow in the transfer chamber 203 causes a turbulent flow of the purge gas in the transfer chamber 203, which may lead to swirling-up of the particles in the transfer chamber and displacement of the wafer during the transfer of the wafer. As a result, adverse effects such as a decrease in a quality of the formed film and a decrease in a throughput may occur. In order to suppress these adverse effects, it is necessary to control the pressure in the cooling chamber 204. In order to perform this pressure control, the flow rate of the purge gas supplied into the transfer chamber 203 is controlled to be greater than the flow rate of the purge gas supplied to the cooling chamber 204.

The flow rate of the purge gas supplied into the transfer chamber 203 may be 100 slm or more and 2000 slm or less in some embodiments. In the case that the gas is supplied at a flow rate smaller than 100 slm, it becomes difficult to completely purge the inside of the transfer chamber 203. Thus, impurities and by-products may remain in the transfer chamber 203. Furthermore, in the case that the gas is supplied at a flow rate larger than 2000 slm, the wafer 200 held at a predetermined position may be displaced when the transfer machine 125 transfers the wafer 200. This may cause a turbulent flow such as a vortex or the like at a corner portion of the housing 202 of the transfer chamber 203 or the like, and may cause swirling-up of the impurities such as particles or the like.

When the flow rate of the gas supplied into the transfer chamber 203 is set as described above, the flow rate of the purge gas supplied into the cooling chamber 204 may be 10 slm or more and 800 slm or less in some embodiments. In the case that the gas is supplied at a flow rate smaller than 10 slm, it becomes difficult to completely purge the inside of the cooling chamber 204. Thus, impurities and by-products may remain in the transfer chamber 203. Further, in the case that the gas is supplied at a flow rate larger than 800 slm, the wafer 200 held at a predetermined position may be displaced when the transfer machine 125 transfers the wafer 200. This may cause a turbulent flow such as a vortex or the like at a corner portion of the case 109 of the cooling chamber or the like, and may cause swirling-up of the impurities such as particles or the like.

When controlling the pressure in the transfer chamber 203 and the pressure in the cooling chamber 204, for example, the pressure value in the transfer chamber 203 detected by the transfer chamber pressure sensor 180 may be controlled to be always higher than the pressure value in the cooling chamber 204 detected by the cooling chamber pressure sensor 407 in some embodiments. That is, the pressure in the transfer chamber 203 may be controlled to be higher than the pressure in the cooling chamber 204 in some embodiments. At this time, in particular, by controlling the pressure difference between the transfer chamber 203 and the cooling chamber 204 so as to be maintained at 0 Pa or more and 100 Pa or less, it is possible to minimize an influence of the pressure in the cooling chamber 204 on the purge gas flow in the transfer chamber 203. In the case that the pressure difference between the transfer chamber 203 and the cooling chamber 204 is 0 Pa, the pressure difference between the transfer chamber 203 and the cooling chamber 204 disappears. Thus, the purge gas supplied to the cooling chamber flows back into the transfer chamber 203, whereby a change occurs in the gas flow inside the transfer chamber 203. Further, in the case that the pressure difference between the transfer chamber 203 and the cooling chamber 204 becomes larger than 100 Pa, the purge gas supplied to the transfer chamber 203 may flow into the cooling chamber 204 in an amount more than necessary, whereby a large change may occur in the gas flow in the transfer chamber 203. In the following description, there will be described a case where the pressure difference between the transfer chamber 203 and the cooling chamber 204 is controlled to become 10 Pa.

First, the control when the pressure in the transfer chamber 203 is reduced by opening the gate valve 205 installed in the process chamber 201 will be described with reference to FIG. 9A.

As shown in FIG. 9A, for example, in a state in which the gate valve 205 arranged in the process chamber 201 is closed during execution of the in-furnace pressure regulation/temperature adjustment step S803 to the modifying step S805 in the substrate processing process, the opening/closing valve 406 is closed so that the pressure in the transfer chamber 203 becomes 50 Pa and the pressure in the cooling chamber 204 becomes 40 Pa, and the MFC 403 is controlled so that the flow rate of the gas supplied from the gas supply nozzle 401 into the cooling chamber 204 becomes 100 slm (STEP 1).

From the state of STEP 1, for example, the substrate unloading step S806 and the like are performed. By opening the gate valve 205 disposed in the process chamber 201, the pressure in the transfer chamber 203 is reduced to 40 Pa, which is detected by the transfer chamber pressure sensor 180 (STEP 2).

When the transfer chamber pressure sensor 180 detects a predetermined pressure value, the controller 121 opens the opening/closing valve 406 and controls the pressure in the cooling chamber 204 so as to decrease (STEP 3). At this time, the gate valve 205 is kept opened.

After the state of STEP 3, for example, when the unloading of the wafer 200 from the process chamber 201 is completed in the substrate unloading step S806, the gate valve 205 is closed. If the gate valve 205 is closed, the controller 121 closes the opening/closing valve and controls the pressure difference between the transfer chamber 203 and the cooling chamber 204 so as to be kept at a predetermined value (STEP 4). By performing control as described above, even in the case that the pressure in the transfer chamber 203 decreases due to the opening of the gate valve 205, it is possible to appropriately adjust the pressure in the cooling chamber 204 and to keep constant the pressure difference between the transfer chamber 203 and the cooling chamber 204. Thus, it is possible to suppress a decrease in film quality and a decrease in throughput without disturbing the gas flow in the transfer chamber 203.

Next, a control when the pressure in the transfer chamber 203 is increased by opening the gate valve 205 installed in the process chamber 201 will be described with reference to FIG. 9B.

As shown in FIG. 9B, for example, in a state in which the gate valve 205 arranged in the process chamber 201 is closed during execution of the in-furnace pressure regulation/temperature adjustment step S803 to the modifying step S805 in the substrate processing process, the opening/closing valve 406 is closed so that the pressure in the transfer chamber 203 becomes 50 Pa and the pressure in the cooling chamber 204 becomes 40 Pa, and the MFC 403 is controlled so that the flow rate of the gas supplied from the gas supply nozzle 401 into the cooling chamber 204 becomes 100 slm (STEP 5). The control of the respective parts in this state is the same as that of STEP 1 described with reference to FIG. 9A.

As the gate valve 205 is opened from the state of STEP 5, the pressure in the transfer chamber 203 is increased to 60 Pa, which is detected by the transfer chamber pressure sensor 180 (STEP 6).

When the transfer chamber pressure sensor 180 detects a predetermined pressure value, the controller 121 controls the MFC 403, while maintaining the opening/closing valve 406 in a closed state, to increase the flow rate of gas supplied from the gas supply nozzle 401 into the cooling chamber to 150 slm so that the pressure in the cooling chamber 204 increases (STEP 7).

When the pressure in the cooling chamber 204 reaches a predetermined value in STEP 7, the controller 121 closes the opening/closing valve and performs control so that the pressure difference between the transfer chamber 203 and the cooling chamber 204 is kept at a predetermined value (STEP 8).

By performing control as described above, even when the pressure in the transfer chamber 203 increases due to the opening of the gate valve 205, it is possible to appropriately adjust the pressure in the cooling chamber 204 and to keep constant the pressure difference between the transfer chamber 203 and the cooling chamber 204. Thus, it is possible to suppress a decrease in film quality and a decrease in throughput without disturbing the gas flow in the transfer chamber 203.

In the present embodiment, there has been described the structure in which a gate valve configured to spatially isolate the transfer chamber 203 and the cooling chamber 204 is not installed, but the present disclosure is not limited thereto. The pressure in the cooling chamber may be controlled even in the case where a gate valve configured to spatially isolate the transfer chamber 203 and the cooling chamber 204 is installed on the side wall of the cooling chamber 204. In addition, a cooling medium pipe 409 through which a cooling medium flows may be installed on the side wall surface of the cooling chamber 204 to improve the cooling efficiency.

(4) Effects of the Present Embodiment

According to the present embodiment, one or more effects described below may be obtained.

(a) By supplying the purge gas into the cooling chamber, it becomes possible to purge impurities and by-products in the cooling chamber, and it becomes possible to suppress a decrease in film quality such as adhesion of impurities to a processed wafer.

(b) By supplying the purge gas into the cooling chamber, it becomes possible to allow the purge gas to function as a cooling gas, and it becomes possible to efficiently cool a processed wafer.

(c) By installing the gas supply system and the gas exhaust system in the cooling chamber, it is possible to control the pressure in the cooling chamber. By making it possible to control the pressure difference between the cooling chamber and the transfer chamber, it is possible to minimize the influence on the gas flow in the transfer chamber.

(d) By minimizing the influence on the gas flow in the transfer chamber, it is possible to suppress a decrease in the throughput of the apparatus and a decrease in the quality of the film formed on the wafer.

Although the present disclosure has been described with reference to the embodiment, the above-described embodiment may be appropriately modified, and the effects thereof may also be obtained.

For example, in the embodiment described above, there has been described the process of modifying an amorphous silicon film as a film containing silicon as a main component into a polysilicon film, but the present disclosure is not limited thereto. The film formed on the surface of the wafer 200 may be modified by supplying a gas containing at least one of oxygen (O), nitrogen (N), carbon C) and hydrogen (H). For example, in the case where a hafnium oxide film ($Hf_xO_y$ film) as a high dielectric film is formed on the wafer 200, a microwave may be supplied to heat the hafnium oxide film while supplying a gas containing oxygen, whereby it possible to supplement the lost oxygen in the hafnium oxide film and to improve the characteristics of the high dielectric film. Although the hafnium oxide film is shown herein, the present disclosure is not limited thereto. The present disclosure may be appropriately applied to a case of modifying an oxide film containing at least one metal element of aluminum (Al), titanium (Ti), zirconium (Zr), tantalum (Ta), niobium (Nb), lanthanum (La), cerium (Ce), yttrium (Y), barium (Ba), strontium (Sr), calcium (Ca), lead (Pb), molybdenum (Mo), tungsten (W) and the like, i.e., a metal-based oxide film. That is, the aforementioned film-forming sequence may be appropriately applied to a case of modifying a TiOCN film, a TiOC film, a TiON film, a TiO film, a ZrOCN film, a ZrOC film, a ZrON film, a ZrO film, a HfOCN film, a HfOC film, a HfON film, a HfO film, a TaOCN film, a TaOC film, a TaON film, a TaO film, a NbOCN film, a NbOC film, a NbON film, a NbO film, an AlOCN film, an AlOC film, an AlON film, an AlO film, a MoOCN film, a MoOC film, a MoON film, a MoO film, a WOCN film, a WOC film, a WON film or a WO film, which is formed on the wafer 200.

In addition to the high dielectric film, a film doped with impurities and containing silicon as a main component may be heated. Examples of the film containing silicon as a main component include Si-based oxide films such as a silicon nitride film (SiN film), a silicon oxide film (SiO film), a silicon oxycarbide film (SiOC film), a silicon oxycarbonitride film (SiOCN film), a silicon oxynitride film (SiON film) or the like. Examples of the impurities include at least one of boron (B), carbon (C), nitrogen (N), aluminum (Al), phosphorus (P), gallium (Ga), arsenic (As) and the like.

Further, the film may be a resist film based on at least one of a polymethyl methacrylate (PMMA) resin, an epoxy resin, a novolac resin, a polyvinyl phenyl resin and the like.

Although a process of manufacturing a semiconductor device has been described above, the present disclosure is not limited thereto but may be applied to a substrate processing technique such as a patterning process of a liquid crystal panel manufacturing process, a patterning process of a solar cell manufacturing process, a patterning process of a power device manufacturing process or the like.

As described above, according to the present disclosure, it is possible to provide an electromagnetic wave processing technique capable of suppressing a decrease in productivity even when a substrate cooling step is provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a transfer chamber configured to transfer a substrate;
at least two process chambers configured to process the substrate that is transferred from the transfer chamber by heating the substrate with a microwave generated from a heating device; and
a cooling chamber spatially connected to the transfer chamber and disposed on a side wall of the transfer chamber between the at least two process chambers at an equal distance from the at least two process chambers, the cooling chamber including a first gas supplier configured to supply a purge gas that purges an internal atmosphere at a first gas flow rate and a first exhauster including an exhaust pipe configured to exhaust the purge gas, and the cooling chamber configured to cool the substrate heated by the microwave using the purge gas.

2. The apparatus of claim 1, wherein the transfer chamber includes a second gas supplier configured to supply the purge gas that purges the internal atmosphere at a second gas flow rate larger than the first gas flow rate.

3. The apparatus of claim 2, further comprising:
a controller configured to control the first gas supplier and the second gas supplier such that the first gas flow rate is 10 slm or more and 800 slm or less and the second gas flow rate is 100 slm or more and 2000 slm or less.

4. The apparatus of claim 2, wherein the exhaust pipe is arranged so as to join an upstream side of the second gas supplier and is configured to form a circulation structure in which the purge gas exhausted from the first exhauster circulates.

5. The apparatus of claim 1, further comprising:
a controller configured to control the first gas supplier and the first exhauster according to detected values of a pressure in the transfer chamber and a pressure in the cooling chamber.

6. The apparatus of claim 1, wherein each of the at least two process chambers includes a third gas supplier configured to supply an inert gas and a second exhauster configured to exhaust the inert gas, and further comprising:
a controller configured to control the first gas supplier, the first exhauster, the third gas supplier and the second exhauster such that a pressure in the transfer chamber is lower than a pressure in each of the at least two process chambers and higher than a pressure in the cooling chamber.

7. The apparatus of claim 6, wherein the controller is further configured to control the first gas supplier, the first exhauster, the third gas supplier and the second exhauster such that, when heating the substrate, the pressure in the transfer chamber is higher than the pressure in each of the at least two process chambers and the pressure in the cooling chamber.

8. The apparatus of claim 5, wherein the controller is further configured to control the first gas supplier and the first exhauster such that a difference between the pressure in the transfer chamber and the pressure in the cooling chamber is greater than 0 Pa and equal to or less than 100 Pa.

9. The apparatus of claim 1, further comprising:
a cooling medium pipe configured to circulate a cooling medium inside a side wall of the cooling chamber.

10. The apparatus of claim 1, wherein the cooling chamber is arranged between the at least two process chambers and on a lateral side of the transfer chamber.

11. A method of manufacturing a semiconductor device, comprising:
transferring a substrate into at least two process chambers of a substrate processing apparatus that includes: a transfer chamber configured to transfer the substrate; the at least two process chambers configured to process the substrate that is transferred from the transfer chamber by heating the substrate with a microwave generated from a heating device; and a cooling chamber spatially connected to the transfer chamber and disposed on a side wall of the transfer chamber between the at least two process chambers at an equal distance from the at least two process chambers, the cooling chamber including a gas supplier configured to supply a purge gas that purges an internal atmosphere at a first gas flow rate and an exhauster including an exhaust pipe configured to exhaust the purge gas, and the cooling chamber configured to cool the substrate heated by the microwave using the purge gas;
heating the substrate in the at least two process chambers;
unloading the heated substrate from the at least two process chambers; and
cooling the heated substrate by transferring the heated substrate unloaded from the at least two process chambers to the cooling chamber.

12. The method of claim 11, wherein the first gas flow rate is 10 slm or more and 800 slm or less.

13. The method of claim 11, wherein in the act of transferring the substrate, the act of unloading the substrate and the act of cooling the substrate, a pressure in the transfer chamber is lower than a pressure in each of the at least two process chambers and higher than a pressure in the cooling chamber.

14. The method of claim 11, wherein in the act of heating the substrate, a pressure in the transfer chamber is higher than a pressure in each of the at least two process chambers and a pressure in the cooling chamber.

15. The method of claim 12, wherein a difference between a pressure in the transfer chamber and a pressure in the cooling chamber is greater than 0 Pa and equal to or less than 100 Pa.

16. A non-transitory computer-readable recording medium storing a program that causes, by a computer, a substrate processing apparatus to perform a process comprising:
    transferring a substrate into at least two process chambers of the substrate processing apparatus that includes: a transfer chamber configured to transfer the substrate; the at least two process chambers configured to process the substrate that is transferred from the transfer chamber by heating the substrate with a microwave generated from a heating device; and a cooling chamber spatially connected to the transfer chamber and disposed on a side wall of the transfer chamber between the at least two process chambers at an equal distance from the at least two process chambers, the cooling chamber including a gas supplier configured to supply a purge gas that purges an internal atmosphere at a first gas flow rate and an exhauster including an exhaust pipe configured to exhaust the purge gas, and the cooling chamber configured to cool the substrate heated by the microwave using the purge gas;
    heating the substrate in the at least two process chambers;
    unloading the heated substrate from the at least two process chambers; and
    cooling the heated substrate by transferring the heated substrate unloaded from the at least two process chambers to the cooling chamber.

17. The recording medium of claim 16, wherein the first gas flow rate is 10 slm or more and 800 slm or less.

18. The recording medium of claim 16, wherein in the act of transferring the substrate, the act of unloading the substrate and the act of cooling the substrate, a pressure in the transfer chamber is lower than a pressure in each of the at least two process chambers and higher than a pressure in the cooling chamber.

19. The recording medium of claim 16, wherein in the act of heating the substrate, a pressure in the transfer chamber is higher than a pressure in each of the at least two process chambers and a pressure in the cooling chamber.

20. The recording medium of claim 16, wherein a difference between a pressure in the transfer chamber and a pressure in the cooling chamber is greater than 0 Pa and equal to or less than 100 Pa.

* * * * *